(12) United States Patent
Kaneko

(10) Patent No.: US 8,666,687 B2
(45) Date of Patent: Mar. 4, 2014

(54) BATTERY PACK CONTROL APPARATUS

(75) Inventor: Kazumi Kaneko, Zama (JP)

(73) Assignee: Nissan Motor Co., Ltd., Yokohama (JP)

( * ) Notice: Subject to any disclaimer, the term of this patent is extended or adjusted under 35 U.S.C. 154(b) by 258 days.

(21) Appl. No.: 12/811,480

(22) PCT Filed: Feb. 24, 2009

(86) PCT No.: PCT/IB2009/000333
§ 371 (c)(1),
(2), (4) Date: Jul. 1, 2010

(87) PCT Pub. No.: WO2009/106952
PCT Pub. Date: Sep. 3, 2009

(65) Prior Publication Data
US 2010/0286938 A1 Nov. 11, 2010

(30) Foreign Application Priority Data

Feb. 27, 2008 (JP) .................................. 2008-046137
Dec. 4, 2008 (JP) .................................. 2008-309475

(51) Int. Cl.
*G01R 31/36* (2006.01)
*H02J 7/00* (2006.01)

(52) U.S. Cl.
USPC ............................................ 702/63; 320/116

(58) Field of Classification Search
USPC ......................... 702/63; 429/61; 320/116, 224
See application file for complete search history.

(56) References Cited

U.S. PATENT DOCUMENTS

2005/0242776 A1  11/2005  Emori et al.
2007/0182377 A1  8/2007  Vandensande
(Continued)

FOREIGN PATENT DOCUMENTS

CN   101119036    2/2008
JP   2003-070179 A  3/2003
(Continued)

OTHER PUBLICATIONS

Extended International Search Report of the corresponding International Application No. PCT/IB2009/000333.

(Continued)

*Primary Examiner* — John Breene
*Assistant Examiner* — Manuel Rivera Vargas
(74) *Attorney, Agent, or Firm* — Global IP Counselors, LLP

(57) ABSTRACT

A battery pack control apparatus is provided with first, second and third monitoring devices, a battery pack control device, first and second communication devices, and a first electric power consuming device. The monitoring devices are connected to the single battery cells of a battery pack to monitor a state of the single battery cells. The battery pack control device communicates data related with the third monitoring device through the first communication device having an electric insulating quality and with the first monitoring device through a second communication device having an electric insulating quality. The second monitoring device communicates data with the first and third monitoring devices. The first electric power consuming device consumes an amount of electric power at a single battery cell connected to the second monitoring device. The amount of electric power corresponds to a communication occurring at the second communication device.

9 Claims, 5 Drawing Sheets

(56) References Cited

U.S. PATENT DOCUMENTS

2008/0284375 A1* 11/2008 Nagaoka et al. .............. 320/116
2009/0027009 A1   1/2009 Sivertsen

FOREIGN PATENT DOCUMENTS

| | | | |
|---|---|---|---|
| JP | 2003070179 A | * | 3/2003 |
| JP | 2007-244058 A | | 9/2007 |
| JP | 2008-035671 | | 2/2008 |
| JP | 2008-289234 A | | 11/2008 |

OTHER PUBLICATIONS

An English translation of the Japanese Notification of Reason for Rejection of corresponding Japanese Application No. 2008-309475, issued on Jul. 10, 2013.

The extended European Search Report for the corresponding European Patent Application No. 09714743.3-2207 dated Oct. 10, 2012.

* cited by examiner

BATTERY PACK CONTROL APPARATUS

CROSS-REFERENCE TO RELATED APPLICATIONS

This U.S. National stage application claims priority to Japanese Patent Application Nos. 2008-046137, filed on Feb. 27, 2008 and 2008-309475, filed on Dec. 4, 2008. The entire disclosures of Japanese Patent Application Nos. 2008-046137 and 2008-309475 are hereby incorporated herein by reference.

BACKGROUND

1. Field of the Invention

The present invention relates to a battery pack control apparatus for controlling a battery pack.

2. Background Information

A battery capacity adjusting apparatus is known for adjusting battery capacities of "n" single battery cells connected in series of a battery pack (see Japanese Laid-Open Patent Publication No. 10-322925). The battery capacity adjusting apparatus has cell controllers that are connected to each of the single battery cells to monitor the voltages and adjust the capacities of the single battery cells and a battery controller contrived to control the cell controllers. In order to prevent a high voltage (electric potential) of the cells connected in series from being conveyed to the battery controller when the battery controller communicates with the cell controllers, the battery capacity adjusting apparatus described in Japanese Laid-Open Patent Publication No. 10-322925 is configured such that each of the cell controllers communicates with the battery controller through a photocoupler.

SUMMARY

It has been discovered that when the communication between the cell controllers and the battery controller is accomplished using a photocoupler between each cell controller and the battery controller, it is necessary to provide a number of photocouplers equal to the number of cell controllers. Since photocouplers are expensive, the cost of such a control apparatus is high.

One aspect of the present invention is to provide a battery pack control apparatus for a battery pack that can reduce the number of photocouplers.

In accordance with this one aspect, a battery pack control apparatus comprises a first monitoring device, a second monitoring device, a third monitoring device, a battery pack control device, a first communication device, a second communication device, and a first electric power consuming device. The first monitoring device is connected to a first single battery cell of a battery pack to monitor a state of the first single battery cell. The second monitoring device is connected to a second single battery cell of the battery pack to monitor a state of the second single battery cell. The third monitoring device is connected to a third single battery cell of the battery pack to monitor a state of the third single battery cell. The battery pack control device controls a battery capacity of the battery pack by producing a command signal. The first communication device has an electric insulating quality provided between the third monitoring device and the battery pack control device such that the third monitoring device receives the command signal from the battery pack control device through the first communication device. The second communication device has an electric insulating quality provided between the first monitoring device and the battery pack control device such that the second monitoring device receives the command signal from the battery pack control device through the third monitoring device, and the first monitoring device receives the command signal from the second monitoring device and sends a detection signal to the battery pack control device through the second communication device. The first electric power consuming device consumes an amount of electric power at a single battery cell connected to the second monitoring device. The amount of electric power corresponds to a communication occurring at the second communication device.

The above aspect and other objects, features, aspects and advantages of the present invention will become apparent to those skilled in the art from the following detailed description, which, taken in conjunction with the annexed drawings, discloses preferred embodiments.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Figure 1:
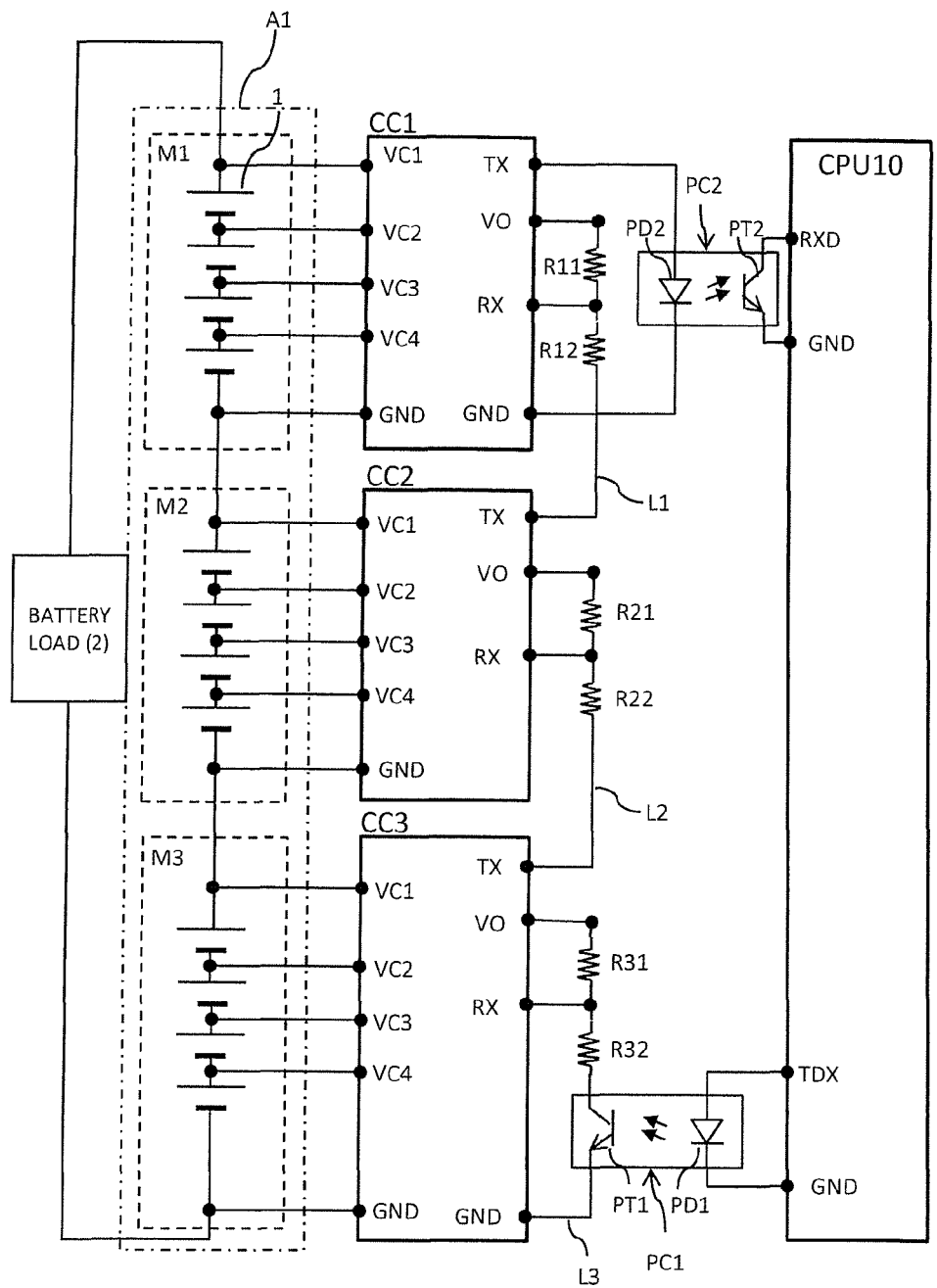
FIG. 1 is block diagram of a battery pack control apparatus in accordance with one embodiment.
Figure 2:
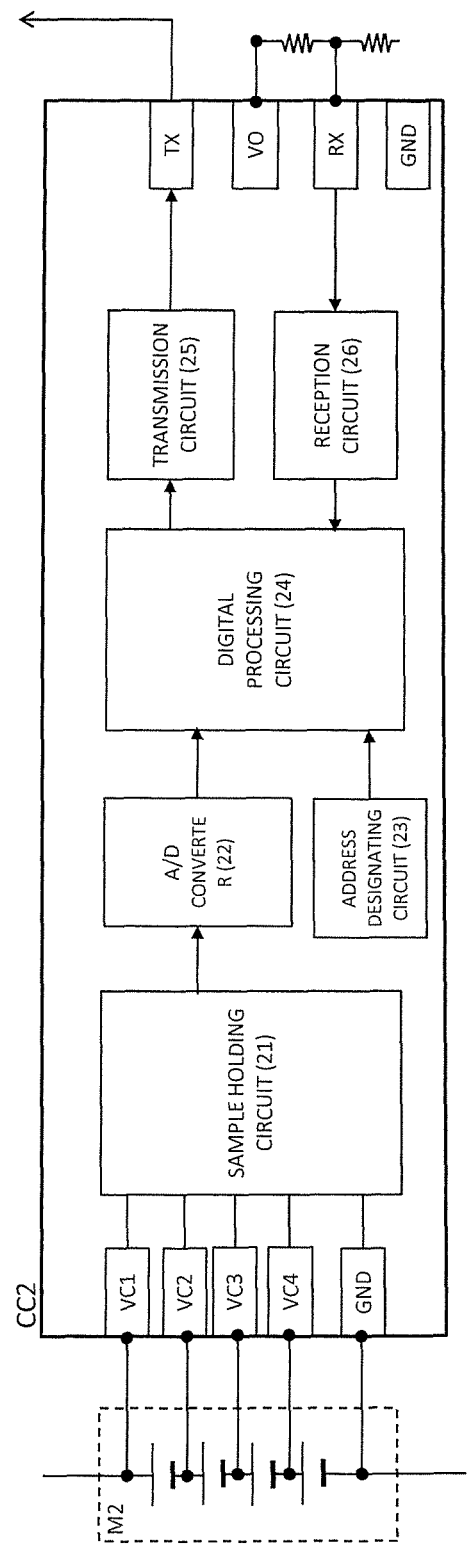
FIG. 2 is a block diagram of a cell controller shown in FIG. 1.

Referring initially to FIG. 1, a battery pack control apparatus is illustrated in accordance with a first embodiment. In the illustrated embodiment, the battery pack control apparatus is used to control a vehicle battery pack A1 for a hybrid vehicle, an electric car, or the like. Basically, FIG. 1 is a block diagram schematically showing the battery pack control apparatus for the vehicle battery pack A1. FIG. 2 is a block diagram of the cell controller CC2 shown in FIG. 1. As explained below, the battery pack control apparatus is configured to minimize a number of photocouplers that are used.

As shown in FIG. 1, the battery pack control apparatus according to this embodiment includes three battery modules M1, M2, M3 and three cell controllers CC1, CC2, and CC3. Each of battery modules M1, M2, M3 includes "n" battery cells 1 (where "n" is any positive integer, e.g., 4 in the example shown in FIG. 1) that are connected in series. The three battery modules M1 to M3 are connected together in series. The cell controllers CC1, CC2, and CC3 are arranged and configured to monitor the battery capacities (more specifically, the voltages VC1 to VC4 of the individual battery cells) of the battery modules M1, M2, and M3, respectively. A battery load 2 (e.g., a motor of an electric car) is connected across the two ends thereof through an inverter or other electric power converting device (not shown).

When electric power is supplied to the battery load 2 from the three battery modules M1 to M3, the battery capacities of the single battery cells 1 will vary from cell to cell due to manufacturing inconsistencies. Therefore, the cell controllers CC1, CC2, and CC3 are employed to detect the voltage of each of the single battery cells 1. The battery capacities of the single battery cells 1 are adjusted at a prescribed timing by supplying electric power from the single battery cells having a large battery capacity to a capacity adjusting resistor (not shown).

FIG. 2 shows the internal structure of the cell controller CC2. The other cell controllers CC1 and CC3 have substantially the same structure. The cell controller CC2 includes four input terminals VC1 to VC4, a ground terminal GND, a sample holding circuit 21, an A/D converter 22 and an address designating circuit 23. The four input terminals VC1 to VC4 receive the voltages of the four individual cells 1 of the battery module M2. The sample holding circuit 21 holds voltage values inputted to the input terminals VC1 to VC4. The A/D converter 22 converts the analog values of detected voltages held by the sample holding circuit 21 into digital values. The address designating circuit 23 stores addresses allocated to the cell controller CC2 as unique values.

The cell controller CC2 further includes a digital processing circuit 24, a transmitter circuit 25 and a receiver circuit 26. The digital processing circuit 24 analyzes a signal received by the receiving circuit 26 while referencing the address designating circuit 23, and generates a corresponding signal as well as a signal based on a signal from the A/D converter 22. The transmitter circuit 25 transmits the generated signals through an output terminal TX. The receiver circuit 26 receives a signal sent to an input terminal RX through a communication signal line L2. The cell controller CC2 also includes a communication power supply terminal VO and a ground terminal GND thereof.

The battery controller 10 (CPU 10) shown in FIG. 1 sends a voltage detection command signal to the cell controllers CC1 to CC3 at a prescribed timing that instructs the cell controllers CC1 to CC3 to detect the voltages of the single battery cells 1. The cell controllers CC1 to CC3 receive the command and transmit the detected voltages of the single battery cells 1 to the battery controller 10. The battery controller 10 computes battery capacity adjustment amounts (more specifically, amounts of time over which electric power is supplied to the capacity adjusting resistors) based on the detected battery voltages and executes capacity adjustments by sending capacity adjustment commands to the cell controllers CC1 to CC3.

During this exchange of battery voltage detection commands and detection data that takes place between the battery controller 10 and the cell controllers CC1 to CC3, it is necessary for the battery controller 10 to be electrically insulated from the cell controllers CC1 to CC3, which are connected to the high-voltage battery modules M1 to M3. Consequently, photocouplers PC1 and PC2, which have an electric insulating quality, are used for the communications between the battery controller 10 and the cell controllers CC1 to CC3.

As shown in FIG. 1, the photocoupler PC1 includes a photodiode PD1 (light emitting element) and a phototransistor PT1 (light receiving element). The photodiode PD1 outputs an optical signal corresponding to a received electric signal. The phototransistor PT1 (light receiving element) converts a received optical signal from the photodiode PD1 into an electric signal indicative of the original command from the battery controller 10 and outputs the electric signal.

The photodiode PD1 is connected to the battery controller 10 on the transmission side of the battery controller 10. The photodiode PD1 converts a command signal received from the battery controller 10 into an optical signal indicative of the command signal from the battery controller 10, and outputs the optical signal. Conversely, the phototransistor PT1 is connected to the cell controller CC3 on the reception side of the battery controller 10. The phototransistor PT1 converts an optical signal received from the photodiode PD1 into an electric signal indicative of the command signal from the battery controller 10, and outputs the electric signal. The driving electric power for the photodiode PD1 is supplied from the battery controller 10. The driving electric power for the phototransistor PT1 is supplied from the battery modules M1 to M3 through the cell controller CC3.

As shown in FIG. 1, the photocoupler PC2 includes a photodiode PD2 (light emitting element) and a phototransistor PT2 (light receiving element). The photodiode PD2 outputs an optical signal corresponding to a received electric signal. The phototransistor PT2 converts the received optical signal into an electric signal, and outputs the electric signal. The photodiode PD2 is connected to the cell controller CC1 on the transmission side of the battery controller 10. The photodiode PD2 converts an electric signal received from the cell controller CC1 into an optical signal, and outputs the optical signal. Conversely, the phototransistor PT2 is connected to the battery controller 10 on the reception side of the battery controller 10. The phototransistor PT2 converts an optical signal received from the photodiode PD2 into an electric signal, and outputs the electric signal. The driving electric power for the phototransistor PT2 is supplied from the battery controller 10. The driving electric power for the photodiode PD2 is supplied from the cell controller CC1.

With this control apparatus, a photocoupler is not used to conduct communication directly between the cell controller CC2 and the battery controller 10. Instead, a cascade arrangement is used in which data is transmitted to the cell controller CC3 from the battery controller 10 and then transmitted from the cell controller CC3 to the cell controller CC2. Meanwhile, the data is transmitted from the cell controller CC2 to the cell controller CC1 and finally from the cell controller CC1 to the battery controller 10 through the photocoupler PC2. As a result, the number of expensive photocouplers can be reduced to two.

With a battery pack control apparatus according to this embodiment, only the cell controllers CC1 and CC3 connected to the photocouplers PC1 and PC2 are arranged to communicate with the battery controller 10 through the photocouplers PC1 and PC2. Consequently, the power consumptions of the two cell controllers CC1 and CC3 are larger than the power consumption of the cell controller 2, which is not connected to a photocoupler. Since the electric power consumed by the cell controllers CC1 to CC3 is supplied from the battery modules being monitored, i.e., the battery modules M1 to M3, respectively, the amount of electric power consumed by the battery modules M1 to M3 increases accordingly. Furthermore, since the electric power consumption of the photodiode PD is larger than the electric power consumption of the phototransistor PT within the photocoupler PC, the electric power consumption of the battery module M1 connected to the photodiode PD2 is larger than the electric power consumption of the battery M3 connected to the phototransistor PT1. Therefore, in order to normalize this variation of power consumption among the single battery cells, two resistors R21 and R22 are provided in the communication signal line L2 of the cell controller CC2 and two resistors R31 and R32 are provided in a communication signal line L3 of the cell controller CC3.

More specifically, the resistors R21 and R22 provided in the communication signal line L2 through which data is exchanged between the cell controllers CC2 and CC3 are selected to consume an amount of electric power from the battery module M2 that corresponds to the exchanged data. The sum of the resistances of the two resistors R21 and R22 (R21+R22) is set to be a resistance value corresponding to the sum of the resistances of the two resistors R11 and R12 of the cell controller CC1 connected to the photodiode PD2 and the internal resistance of the photodiode PD2 (R11+R12+photodiode internal resistance).

The resistors R31 and R32 are selected to consume an amount of electric power from the battery module M3 being monitored by the cell controller C3. The sum of the resistances of the two resistors R31 and R32 (R31+R32) is set to be a resistance value corresponding to the sum of the resistances of the two resistors R11 and R12 and the internal resistance of the photodiode PD2 minus the internal resistance of the phototransistor PT1 (R11+R12+photodiode internal resistance−phototransistor internal resistance).

Figure 3:
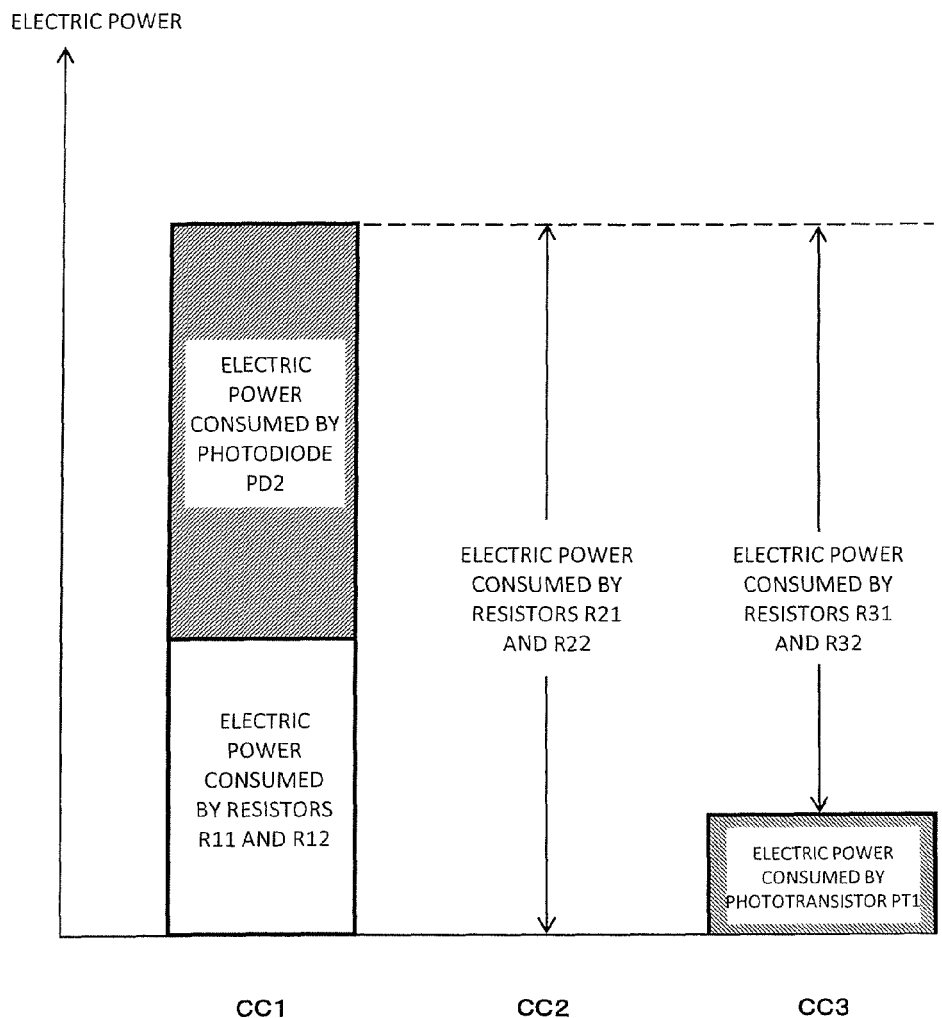
FIG. 3 is a diagram for explaining an imbalance of electric power consumption among the three cell controllers shown in FIG. 1.

FIG. 3 illustrates the relationships among the resistance values of the resistors R11, R12, R21, R22, R31 and R32 provided in the cell controllers CC1 and CC3 and the three cell controllers CC1 to CC3 and the internal resistances of the photodiode PD2 and the phototransistor PT1.

When a voltage detection command signal is transmitted from the battery controller 10 to the cell controller CC3 instructing to measure single battery cell voltages, electric power is consumed by the phototransistor PT1 and the resistors R31 and R32 at the cell controller CC3 before the voltage detection command signal is sent to the cell controller CC2. Electric power is then consumed by the resistors R21 and R22 at the cell controller CC2.

The voltage detection command signal is then transmitted to the cell controller CC1 and, again, electric power is consumed by the resistors R11 and R12 at the cell controller CC1. Finally, electric power is consumed by the photodiode PD2 when a corresponding voltage detection signal is transmitted to the battery controller 10.

The variation of the power consumption among the battery modules M1, M2, and M3 that occurs during communications between the battery controller 10 and the cell controllers CC1 to CC3 can be reduced because the amounts of power consumed by the power consuming electric elements are balanced as shown in FIG. 3.

Each pair of resistors R11 and R12, R21 and R22, and R31 and R32 functions as a voltage dividing resistor serving to divide a voltage at the communication power supply terminal VO of the corresponding cell controller CC1, CC2, or CC3 into an appropriate voltage for a signal transmitted to the input terminal RX.

The cell controllers CC1 and CC3 constitute to the first and third monitoring devices, respectively. The battery controller 10 constitutes to a battery pack control device. The photocouplers PC1 and PC2 constitute first and the communication devices, respectively. The resistors R21 and R22 constitute to a first power consuming device. The resistors R31 and R32 constitute a second power consuming device. The photodiodes PD1 and PD2 of the photocouplers PC1 and PC2 correspond to the transmission side communication devices and the phototransistors PT1 and PT2 correspond to the reception side communication devices.

The first embodiment uses a cascaded communication arrangement in order to reduce the number of photocouplers. The imbalance of electric power consumption between the cell controllers CC1 and CC3 that are connected to photocouplers and the cell controller CC2 that is not connected to a photocoupler is resolved using the resistors R21, R22, R31, and R32. However, with such a circuit configuration and communication method, power consumption imbalances sometimes occur among the cell controllers CC1 to CC3 depending on the data exchanged between the battery controller 10 and the cell controllers CC1 to CC3.

Figure 4:
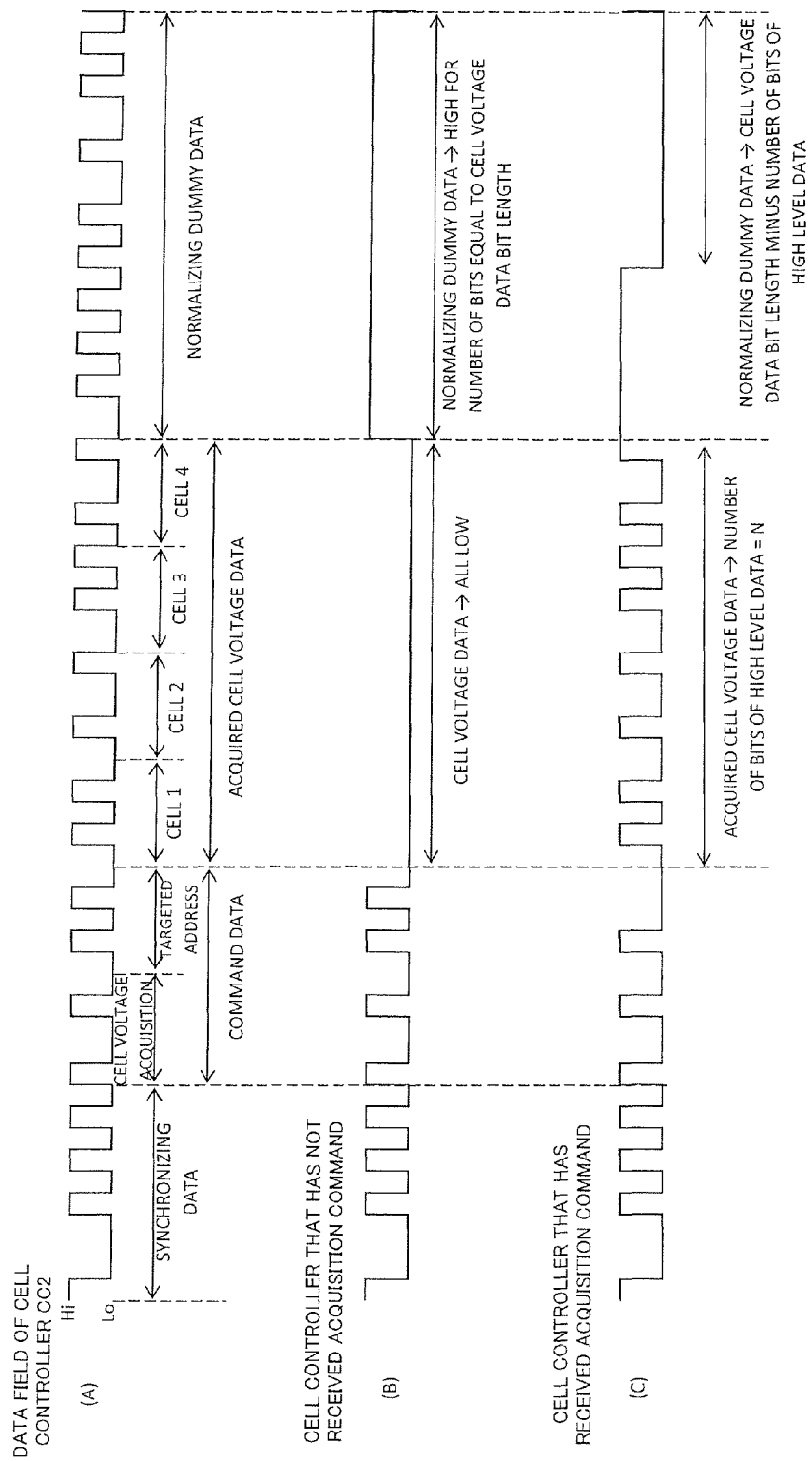
FIG. 4 is a diagram illustrating a data structure for communication between the battery controller and the cell controllers shown in FIG. 1.

Part (A) of FIG. 4 illustrates a structure of data exchanged between the battery controller 10 and the cell controllers CC1 to CC3. The structure of the data exchanged between the battery controller 10 and the cell controller CC2 will now be explained. As shown in FIG. 4, the data in this embodiment is in the form of a digital signal comprising high level signals and low level signals with a synchronizing data field of a prescribed bit length (number of bits) at the head of the data. The synchronizing data serves to synchronize the transfer of data between the battery controller 10 and the cell controller CC2 when data is exchanged.

The next field is command data produced by the battery controller 10. The command data includes a prescribed number of bits for a command that instructs a cell controller to acquire a cell voltage and a prescribed number of bits for an address of the targeted cell controller being instructed to acquire the cell voltage (an address stored in the address designating circuit 23 of FIG. 2). In this example, the targeted address is the address of the cell controller CC2. Each of the cell controllers CC1 to CC3 compares the targeted address in the signal to its own address as stored in the address designating circuit 23 to determine if it is being commanded to detect a cell voltage of the battery monitor that it monitors.

The next field is voltage data acquired by the controller CC2 for each cell. The detected voltages pass through the sample holding circuit 21 and the A/D converter 22 and are written to this field as voltage data by the digital processing circuit 24. In this embodiment, since each battery cell comprises four single battery cells, fields CELL1 to CELL4 are provided for writing the voltage data of each of the single battery cells. Each of the fields CELL1 to CELL 4 has a prescribed bit length. Cell controllers that do not correspond to the targeted address of the command data generated by the battery controller 10 do not write anything to these voltage data fields (i.e., the fields remain at all low level signals).

The final field is for writing normalizing dummy data, which serves to normalize the electric power consumption. For example, if a ten-bit field is provided for the acquired voltage data of each of the single battery cells (total of forty bits), then the normalizing dummy data field is also set to a bit length of forty bits.

Figure 5:
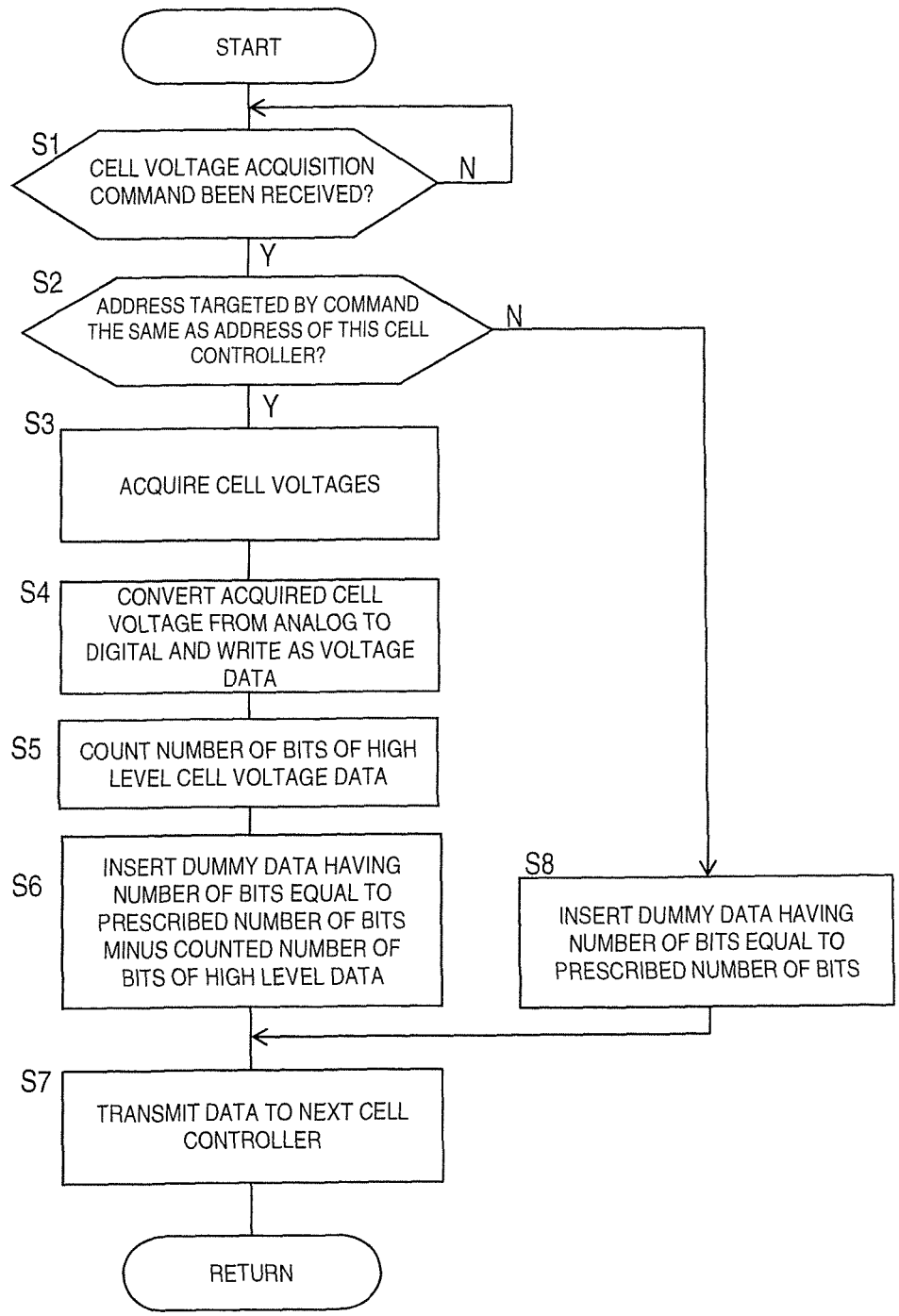
FIG. 5 is a flowchart of control steps executed by the cell controller shown in FIG. 1.

A procedure for writing normalizing dummy data will now be explained. Parts (B) and (C) of FIG. 4 are diagrams for explaining the procedure of writing normalizing dummy data. FIG. 5 is a flowchart showing the control steps executed by a cell controller.

In step S1 of FIG. 5, the cell controller determines if a cell voltage acquisition command has been received. If so, then, in step S2, the digital processing circuit 24 of the cell controller compares the targeted address data contained in the command data to the address of the cell controller stored in the address designating circuit 23. If the targeted address of the command matches the address of the cell controller, then the cell controller proceeds to step S3. Otherwise, the cell controller proceeds to step S8.

In step S8, since it is not necessary to acquire voltage data for the battery module monitored by the cell controller, the cell controller writes a low level signal to the acquired voltage data field as shown in Part (B) of FIG. 4 and writes a high level signal having the same bit length (or a prescribed bit length N0) in the normalizing dummy data field. Other than a bit length equal to the bit length of the field into which acquired voltage data is written, the prescribed bit length N0 can a number that is related to the bit length of the field, such as twice, thrice, or one half the bit length of the field.

In step S8, the cell controller writes the dummy data of the prescribed bit length to the normalizing dummy data field and proceeds to step S7, where it transmits the data to the next cell controller.

Conversely, if it determines in step S2 that the voltage acquisition command matches its own address, then the cell controller proceeds to step S3 and step S4, in which the digital processing circuit 24 (corresponds to second monitoring device data writing section) acquires voltage values through the sample holding circuit 21 and the A/D converter 22 and writes the voltage values as voltage data (a digital signal corresponding to the voltage values) in the data field for acquired voltages.

In step S5, the cell controller then counts the number of bits containing a high level signal among the digital data written to the acquired voltage data field. The following explanation assumes the number of high level signals counted is N.

In step S6, the cell controller subtracts the number N of bits containing a high level signal counted in step S5 from the prescribed number of bits N0 of the normalizing dummy data field and writes high level signals to a number of bits of the normalizing dummy data field equal to the calculated difference N0−N. After writing the dummy data, the cell controller proceeds to step S7 and transmits the data to the next cell controller.

A comparison of parts (B) and (C) of FIG. 4 clearly shows that when a cell controller receives a command to acquire voltage data, that cell controller writes digital signals corresponding to the acquired voltage values in the acquired voltage data field and the digital signals are generated by consuming electric power from the battery module that the cell controller monitors. Conversely, the cell controllers that do not receive the acquisition command write low level signals to the acquired voltage data field and, thus, do not consume any electric power.

Therefore, an imbalance of power consumption occurs between the battery module corresponding to the cell controller that received the acquisition command and the battery modules of the cell controllers that did not receive the acquisition command. However, in a battery pack control apparatus according to this embodiment, a normalizing dummy field is provided and high level signals are written to both the acquired voltage data field and the normalizing dummy data field such that the total number of bits to which high level signals are written by each of the cell controllers CC1 to CC3 is the same. In this way, the power consumption from each of the battery modules is made to be equal regardless of whether or not there is any acquired voltage data and regardless of the values.

It is also possible to reverse the high level signals and low level signals written to the voltage data field and the normalizing dummy data field shown in parts (B) and (C) of FIG. 4.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired.

For example, in a battery pack control apparatus according to the embodiment, one cell controller CC1 to CC3 is provided with respect to each battery module M1 to M3 and each of the battery modules M1 to M3 comprises n single battery cells 1 (in the example shown in FIG. 1, n=4). However, the battery pack control apparatus is not limited to this configuration and it is possible to provide one cell controller with respect to each single battery cell 1.

Although a battery pack control apparatus according to the embodiment is provided with three cell controllers, the invention is not limited to this number. Any number of cell controllers is acceptable so long as there is a cell controller connected to a photocoupler and a cell controller not connected to a photocoupler. For example, in the example shown in FIG. 1, there is only one monitoring device (i.e., the second monitoring device CC2) that is not connected to a photocoupler, and the second monitoring device CC2 communicates directly with the first and third monitoring devices CC1 and CC3. However, if there is a plurality of cell controllers that are not connected to a photocoupler, then there will be a plurality of second monitoring devices and there will be a second monitoring device that communicates indirectly with the first or third monitoring device.

Also, although a battery pack control apparatus according to the embodiment uses a photocoupler as a communication device having an electric insulating quality, the invention is not limited to using a photocoupler. Any device that enables the battery controller 10 to be electrically insulated from the cell controllers CC1 to CC3 and also to communicate with the cell controllers CC1 to CC3 is acceptable. For example, a wireless system could be used.

Moreover, components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A battery pack control apparatus comprising:
a first monitoring device connected to a first single battery cell of a battery pack to monitor a state of the first single battery cell;
a second monitoring device connected to a second single battery cell of the battery pack to monitor a state of the second single battery cell;
a third monitoring device connected to a third single battery cell of the battery pack to monitor a state of the third single battery cell;
a battery pack control device that controls a battery capacity of the battery pack by producing a command signal;
a first communication device having an electric insulating quality provided between the third monitoring device and the battery pack control device such that the third monitoring device receives the command signal from the battery pack control device through the first communication device;
a second communication device having an electric insulating quality provided between the first monitoring device and the battery pack control device such that the second monitoring device receives the command signal from the battery pack control device through the third monitoring device, and the first monitoring device receives the command signal from the second monitoring device and the first monitoring device sends a detection signal to the battery pack control device through the second communication device; and a first electric power consuming device that consumes an amount of electric power at the single battery cell connected to the second monitoring device, the amount of electric power corresponding to a communication occurring at the second communication device, the first electric power consuming device including a pair of resistors that divide a voltage at a communication power supply terminal of the second monitoring device, the resistors being serially provided in a second signal line through which the second monitoring device communicates the command signal with respect to the third monitoring device, the second signal line extending between an output terminal of the third monitoring device and the communication power supply terminal of the second monitoring device, the second signal line including a connecting point between the resistors and further extending between the connecting point and an input terminal of the second monitoring device.

2. The battery pack control apparatus as recited in claim 1, wherein the first communication device includes a photocoupler that includes a first photodiode for outputting an optical signal corresponding to the command signal received from the battery pack control device and a first phototransistor for converting the optical signal received from the first photodiode into an electric signal and for outputting the electric signal.

3. The battery pack control apparatus as recited in claim 2, wherein the second communication device includes a photocoupler that includes a second photodiode for outputting an optical signal corresponding to the command signal received from the first monitoring device and a second phototransistor for converting the optical signal received from the second photodiode into an electric signal and for outputting the electric signal.

4. The battery pack control apparatus as recited in claim 3, further comprising a second electric power consuming device provided in a third signal line through which the third monitoring device communicates the command signal with respect to the battery pack control device, with the second electric power consuming device being arranged to consume an amount of electric power corresponding to an amount of electric power obtained by subtracting an amount of electric power consumed by the third monitoring device from an amount of electric power consumed by the first communication device.

5. The battery pack control apparatus as recited in claim 4, wherein the second electric power consuming device includes a resistor provided in the third signal line, the third signal line extending between the first phototransistor of the first communication device and an input terminal of the third monitoring device.

6. The battery pack control apparatus as recited in claim 1, further comprising a second electric power consuming device provided in a third signal line through which the third monitoring device communicates the command signal with respect to the battery pack control device, with the second electric power consuming device being arranged to consume an amount of electric power corresponding to an amount of electric power obtained by subtracting an amount of electric power consumed by the third monitoring device from an amount of electric power consumed by the first communication device.

7. The battery pack control apparatus as recited in claim 6, wherein the second electric power consuming device includes a resistor provided in the third signal line, the third signal line extending between an output terminal of the first communication device and an input terminal of the third monitoring device.

8. The battery pack control apparatus as recited in claim 1, wherein the second communication device includes a photocoupler that includes a second photodiode for outputting an optical signal corresponding to the command signal received from the first monitoring device and a second phototransistor for converting the optical signal received from the second photodiode into an electric signal and for outputting the electric signal.

9. The battery pack control apparatus as recited in claim 1, wherein the battery pack control device outputs the command signal to the third monitoring device with the command signal including a dummy data region and a voltage data region corresponding to each of the first, second and third monitoring devices; and the third monitoring device includes a third monitoring device data writing section that writes voltage data of the third single battery cell monitored by the third monitoring device in the voltage data region corresponding to the third monitoring device; and the second monitoring device includes a second monitoring device data writing section that writes voltage data of the second single battery cell monitored by the second monitoring device into the voltage data region corresponding to the second monitoring device and that writes dummy data corresponding to an amount of voltage data written by the third monitoring device into the dummy data region corresponding to the second monitoring device.

* * * * *